United States Patent
Ang et al.

(10) Patent No.: US 6,232,217 B1
(45) Date of Patent: May 15, 2001

(54) POST TREATMENT OF VIA OPENING BY N-CONTAINING PLASMA OR H-CONTAINING PLASMA FOR ELIMINATION OF FLUORINE SPECIES IN THE FSG NEAR THE SURFACES OF THE VIA OPENING

(75) Inventors: Arthur Ang; Xu Yi, both of Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/584,429

(22) Filed: Jun. 5, 2000

(51) Int. Cl.$^7$ ................................. H01L 21/4763
(52) U.S. Cl. .................. 438/624; 438/786; 438/798
(58) Field of Search ...................... 438/622, 624, 438/786, 798; 257/760

(56) References Cited

U.S. PATENT DOCUMENTS

| | | | |
|---|---|---|---|
| 5,244,535 | 9/1993 | Ohtsuka et al. | 156/643 |
| 5,643,407 | 7/1997 | Chang | 156/644.1 |
| 5,763,010 | 6/1998 | Guo et al. | 427/376.2 |
| 5,827,785 | 10/1998 | Bhan et al. | 438/784 |
| 5,904,566 | 5/1999 | Tao et al. | 438/689 |
| 5,970,376 | 10/1999 | Chen | 438/637 |
| 5,976,626 | 11/1999 | Matsubara et al. | 427/307 |
| 6,008,118 | * 12/1999 | Yeh et al. | 438/629 |
| 6,008,120 | * 12/1999 | Lee | 438/634 |
| 6,074,941 | * 6/2000 | Hsieh et al. | 438/624 |
| 6,077,784 | * 6/2000 | Wu et al. | 438/691 |

* cited by examiner

Primary Examiner—T. N. Quach
(74) Attorney, Agent, or Firm—George O. Saile; Rosemary L. S. Pike; Stephen G. Stanton

(57) ABSTRACT

A method of forming a metal interconnect within a fluorinated silica glass dielectric layer while preventing outgassing from the fluorinated silica glass dielectric layer comprising the following steps. A semiconductor structure having a semiconductor device structure formed therein is provided. A metal line is formed over the semiconductor structure. The metal line being electrically connected with the semiconductor device structure. An insulating layer is formed over the semiconductor structure, covering the metal line. A fluorinated silica glass dielectric layer is formed over the insulating layer. The fluorinated silica glass dielectric layer is planarized to form a planarized fluorinated silica glass dielectric layer. The planarized fluorinated silica glass dielectric layer and the insulating layer are patterned to form a via opening to the metal line, and exposing portions of the patterned fluorinated silica glass dielectric layer within the via opening. The via opening is treated with a plasma selected from the group comprising an N-containing plasma, an H-containing plasma, and a combination thereof. A metal interconnect is then formed within the via opening.

34 Claims, 3 Drawing Sheets

US 6,232,217 B1

POST TREATMENT OF VIA OPENING BY N-CONTAINING PLASMA OR H-CONTAINING PLASMA FOR ELIMINATION OF FLUORINE SPECIES IN THE FSG NEAR THE SURFACES OF THE VIA OPENING

FIELD OF THE INVENTION

The present invention relates generally to methods of forming metal interconnects in semiconductor devices and specifically to forming such metal interconnects within FSG ILD and IMD layers.

BACKGROUND OF THE INVENTION

Metal interconnects are attacked by fluorine (F) species from fluorinated silica glass (FSG) interlevel dielectric (ILD) or intermetal dielectric (IMD) layers. The F species attacks on the metal interconnects forms metal fluorides, which are non-conducting and causing electrical resistance or loose contacts.

For example, U.S. Pat. No. 5,244,535 to Ohtsuka et al. describes a method of manufacturing a semiconductor device including a nitrogen-containing plasma treatment of contact holes. The contact holes are etched through an insulation layer (for example $SiO_2$) with a fluorine-based gaseous plasma, and the contact holes are then immediately flooded with the nitrogen-containing plasma that inhibits formation of reaction products on the exposed portion of the contact holes.

U.S. Pat. No. 5,643,407 to Chang describes a method of forming via openings through an intermetal dielectric (IMD) layer (comprised of spin-on-glass (SOG) sandwiched between two layers of silicon oxide ($SiO_2$)) to an underlying patterned first metal layer. A vacuum bake is used to remove moisture from the exposed SOG layer within the via opening and then a nitrogen plasma treatment converts the SOG layer from an organic to an inorganic material. The inorganic SOG layer material has less moisture absorption, and suppresses outgassing from the rest of the organic SOG layer to prevent poisoned via metallurgy.

U.S. Pat. No. 5,970,376 to Chen describes a method for forming a via through a dielectric layer within a microelectronics fabrication. A via is formed through a low dielectric constant dielectric layer (formed from a silsequioxane SOG dielectric material) by a fluorine-containing plasma etch method. The fluorine-containing plasma etch method also simultaneously forms a fluorocarbon polymer residue layer on a sidewall of the etched via. A plasma treatment is then applied to the via to form a plasma treated fluorocarbon polymer residue layer. The plasma treated fluorocarbon polymer residue layer on the sidewall of the via may then be stripped, and is stripped, with an oxygen containing plasma.

U.S. Pat. No. 5,976,626 to Matsubara et al. describes a method of manufacturing a semiconductor without corrosion in wiring, for example. A silicon oxide film is formed on a substrate, covering a first wiring formed with a silicon oxide film therebetween. A thick-film inorganic SOC film is then coated on the silicon oxide film and a thermal treatment is then applied. A silicon oxide film is then formed and a via hole is then formed through to the first wiring. A thermal treatment at 150–550° C. and not more than $10^{-3}$ Torr pressure is then carried out with a portion of the thick-film inorganic SOC film exposed at a side surface of the via hole. Residual gas, such as $CO_2$ and $H_2O$ adsorbed to the side surface of the via hole is released so that subsequently formed wiring within the via hole will not be corroded.

U.S. Pat. No. 5,763,010 to Guo et al. describes a method of stabilizing halogen-doped silicon oxide film to reduce halogen atoms migrating from the film during subsequent processing steps. A halogen-doped film is deposited over a substrate and is then subjected to a degassing step by briefly heating the film to between about 300 and 550° C. before deposition of a diffusion barrier layer. The heat treatment is thought to remove loosely bonded halogen atoms from the halogen-doped film. In a preferred embodiment, the halogen-doped silicon oxide film is FSG film that is subjected to a degassing treatment for between about 35 and 50 seconds.

U.S. Pat. No. 5,827,785 to Bhan et al. describes a method and apparatus for improving film stability of a halogen-doped silicon oxide layer. A process gas is introduced including a first and second halogen source into a deposition chamber along with silicon and oxygen sources. A plasma is then formed from the process gas to deposit a halogen-doped layer over a substrate within the chamber. The additional halogen source, i.e. the second halogen source, is believed to enhance the etching effect of the film and this enhanced etching component of the film deposition improves the film's gap-fill capabilities and helps stabilize the film. In the preferred embodiment, the halogen-doped film is a fluorosilicate glass (FSG) film; $SiF_4$ is the first halogen source; TEOS is the source of the silicon; and the second halogen source is either $F_2$ or $NF_3$.

U.S. Pat. No. 5,904,566 to Tao et al. describes a method for forming a via through a nitrogenated silicon oxide layer. A reactive ion etch (RIE) plasma etch is used to create a via opening is formed through a nitrogenated silicon oxide layer to an underlying substrate. The RIE method uses an etchant gas composition comprising: a perfluorocarbon having a carbon: fluorine atomic ratio of at least about 1:3; oxygen; and argon.

SUMMARY OF THE INVENTION

Accordingly, it is an object of the present invention to provide a method of forming a metal interconnect within a fluorinated silica glass dielectric layer while preventing outgassing from the fluorinated silica glass dielectric layer.

Another object of the present invention is to provide a method of forming a metal interconnect in a via opening within a fluorinated silica glass dielectric layer while eliminating fluorine species on the exposed surface of the fluorinated silica glass dielectric layer within the via opening to reduce the possibility of forming metal fluorides.

Other objects will appear hereinafter.

It has now been discovered that the above and other objects of the present invention may be accomplished in the following manner. Specifically, a semiconductor structure having a semiconductor device structure formed therein is provided. A metal line is formed over the semiconductor structure. The metal line being electrically connected with the semiconductor device structure. An insulating layer is formed over the semiconductor structure, covering the metal line. A fluorinated silica glass dielectric layer is formed over the insulating layer. The fluorinated silica glass dielectric layer is planarized to form a planarized fluorinated silica glass dielectric layer. The planarized fluorinated silica glass dielectric layer and the insulating layer are patterned to form a via opening to the metal line, and exposing portions of the patterned fluorinated silica glass dielectric layer within the via opening. The via opening is treated with a plasma selected from the group comprising an N-containing plasma, an H-containing plasma, and a combination thereof. A metal interconnect is then formed within the via opening.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
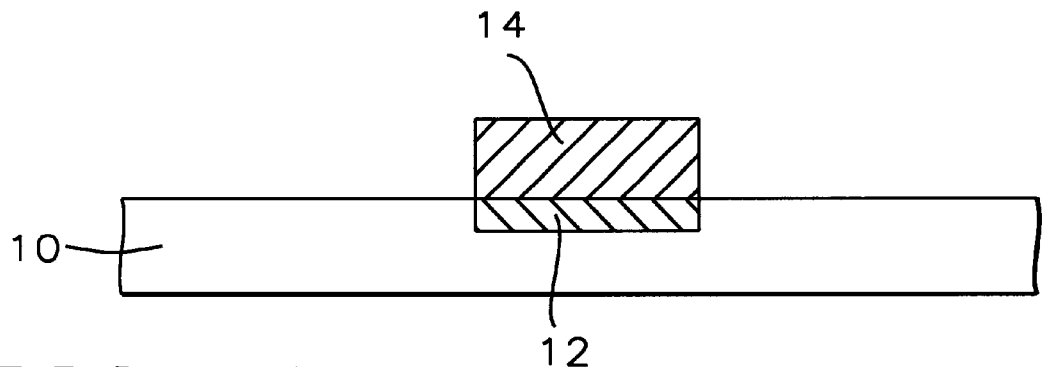
FIGS. 1 through 8 schematically illustrate in cross-sectional representation a preferred embodiment of the present invention with FIGS. 5 and 6 illustrating one proposed mechanism and FIGS. 7 and 8 illustrating another proposed mechanism.

Accordingly as shown in FIG. 1, starting semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

Semiconductor structure 10 includes exposed semiconductor devices or interconnect lines at indicated at 12.

At least one metal line 14 is formed over semiconductor structure 10 so as to contact underlying semiconductor device/interconnect line 12. Metal line 14 may be comprised of aluminum or copper and is preferably copper.

Figure 2:
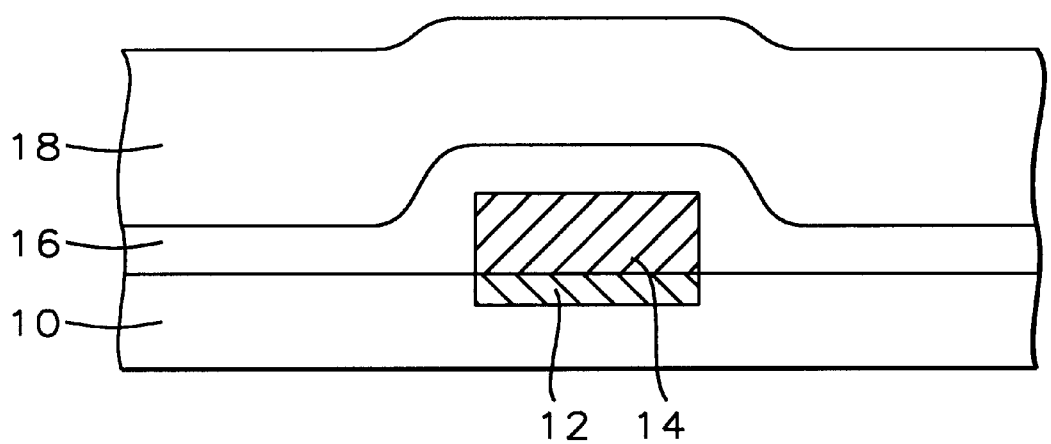

As shown in FIG. 2, insulating layer 16 is formed over the surface of semiconductor structure 10 and over metal line 14. Insulating layer 16 is from about 500 to 3000 Å thick and more preferably from about 800 to 2000 Å thick, and may be formed of polymer, silica glass, silicon nitride, or silicon oxynitride and is preferably undoped silica glass (USG). For purposes of illustration, insulation layer 16 will be considered to be comprised of USG hereafter.

Formation of FSG Layer 18

Fluorinated silica glass (FSG) layer 18 is then deposited over USG layer 16 preferably by either a PECVD or HDCVD process. FSG layer 18 can consist of nitrogen, boron, phosphorus, or a combination thereof as a stabilizer.

FSG layer 18 is from about 8000 to 22,000 Å thick, and more preferably from about 12,000 to 18,000 Å. The concentration of fluorine (F) within FSG layer 18 is preferably from about 0.5 to 8.0 atom %, and more preferably from about 1 to 4.5 atom %.

Figure 3:
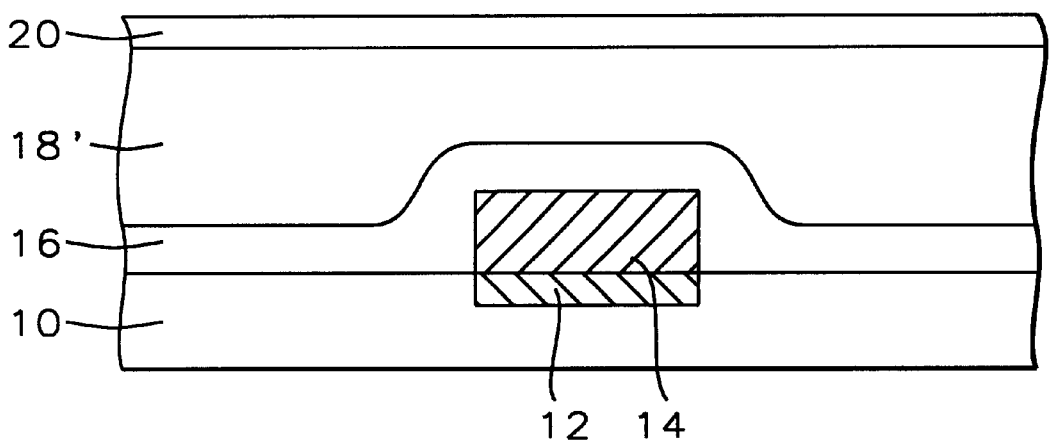

As shown in FIG. 3, FSG layer 18 is planarized by, for example, chemical-mechanical polishing (CMP), to form planarized FSG layer 18'. Planarized FSC layer 18' is from about 4000 to 12,000 Å thick, and is more preferably from about 4500 to 11,500 Å thick.

Optionally, a capping layer/hard mask layer 20 may then be formed over planarized FSG layer 18' to a thickness of from about 500 to 4000 Å, and more preferably from about 1000 to 3000 Å.

Hard mask layer 20 may be comprised of undoped silica glass, phosphorus doped silica glass, boron doped silica glass, boron-phosphorus doped silica glass, silicon nitride, or silicon oxynitride, and is more preferably silicon-rich oxide (SRO). SRO is a silicon oxide layer containing excessive silicon. For purposes of illustration, hard mask layer 20 will be considered to be comprised of SRO hereafter.

SRO layer 20 may be formed as follows, which is essentially the same method as forming a silicon oxide layer by a chemical vapor deposition (CVD). Monosilane and nitrogen monoxide gasses are introduced through mutually different gas inlets into an LPCVD oven having a quartz reaction tube which can introduce a vacuum and a heater for heating the reaction tube. The LPCVD oven is set to from about 700 to 800° C. with nitrogen gas used as the atmosphere gas. The overall pressure of these gases is maintained at about 1 torr. An excessive amount of silicon is provided in the silicon dioxide layer by varying the gas flow ratio of the monosilane and nitrogen monoxide to increase the gas flow rate of monosilane. According to the increase of the proportion of the monosilane, the amount of the excessive silicon is increased to form an SRO layer. The SRO layer is an insulator having a structure in which fine silicon aggregate is mixed in the silicon oxide ($SiO_2$) layer.

Figure 4:
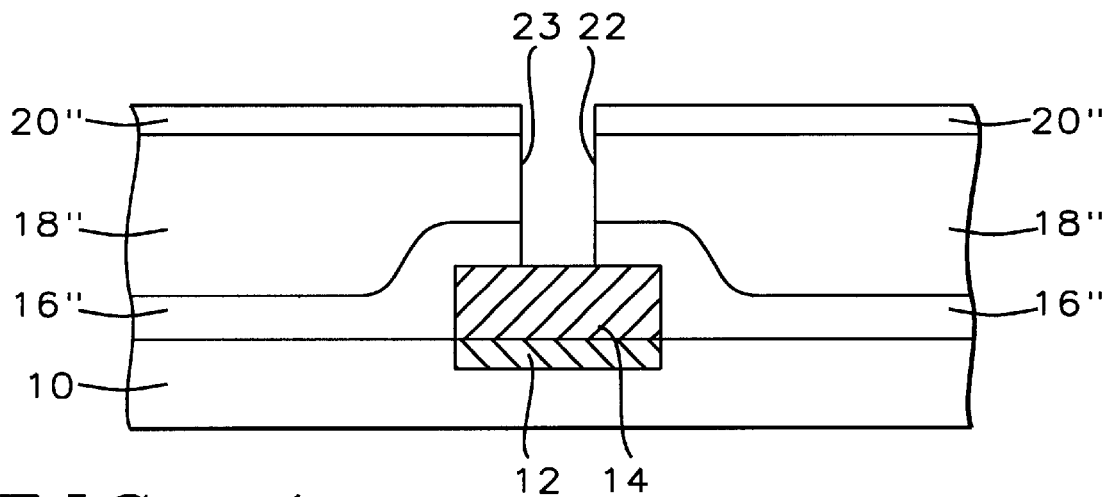

As shown in FIG. 4, SRO layer 20, planarized FSG layer 18', and USG layer 16 are patterned to form via opening 22 to metal line 14. Via opening 22 has a height to width ratio of from about 1:1 to 20:1, and more preferably from about 2:1 to 15:1.

This patterning may be accomplished by, for example, forming a photoresist layer (not shown) over SRO layer 20 and patterning the photoresist to form a photoresist mask. The photoresist mask could then be used to etch SRO layer 20, planarized FSG layer 18', and USG layer 16 to form via opening 22. The photoresist layer would then be stripped and removed.

Via opening 22 exposes portions 23 of patterned FSG layer 18" and also portions of patterned SRO layer 20" and portions of patterned USG layer 16".

Problem the Invention Solves

The inventors have found that absent further processing, F would outgas, or diffuse, from patterned FSG layer 18" to and through exposed portion 23 of via opening 22 and react with any metal interconnect formed within via opening 22 to form metal fluoride compounds. Such metal fluoride compounds would deleteriously affect the conductivity of the metal interconnect, and thus the semiconductor devices. A critical point of this invention is the recognition of this problem.

Nitrogen Containing Plasma Treatment of Via Opening 22

Figure 5:
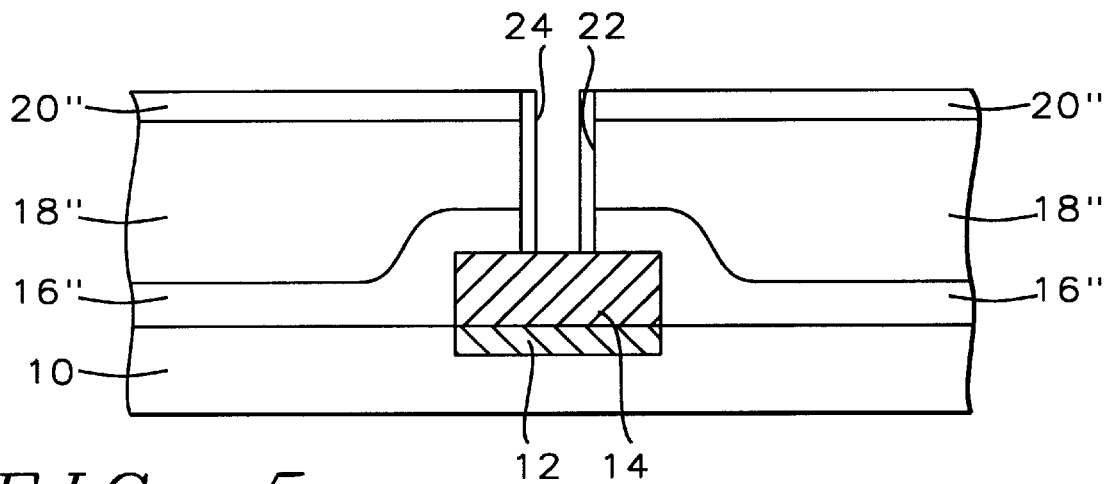

As shown in FIG. 5 in a key step of the invention, either an N-plasma or an H-plasma is used to treat at least the exposed portions 23 of patterned FSG layer 18". Although it is not known, based upon the type of plasma used, two proposed mechanisms serve to prevent outgassing of fluorine (F) from FSG layer 18".

Oxynitride Layer Formation Proposed Mechanism

If an N-plasma is used, and in the first proposed mechanism, a thin oxynitride layer 24 may be formed at least over the exposed portions 23 of patterned FSG layer 18", and may also be formed over the exposed portions of patterned SRO layer and patterned USG layer within via opening 22. The exposed portions 23 of patterned FSG layer 18" form a silicon-rich oxynitride layer.

Oxynitride layer 24 acts as a barrier against the outgassing or diffusion of F species from the inner, unexposed, portions of patterned FSG layer 18".

Oxynitride layer 24 has a thickness from about 30 to 1000 Å, more preferably from about 60 to 500 Å.

Oxynitride layer 24 is formed by treating the exposed via opening 22 with a nitrogen (N)-containing plasma at the following parameters:

temperature: from about 0 to 520° C., and more preferably from about 20 to 450° C.;

pressure: from about 0.001 to 10 Torr, and more preferably from about 0.005 to 5 Torr;

power: from about 20 to 2000 W, and more preferably from about 50 to 1000 W;

time: from about 3 to 300 seconds, and more preferably from about 10 to 150 seconds; and tools: a PECVD, HDCVD or plasma etcher.

The N-containing plasma may be: an $N_2$ plasma; an $NH_3$ plasma, an $NH_2$—$NH_2$ plasma, one the these above-plasmas with an $H_2$ plasma, or a combination of two or more of the above-plasmas with or without an $H_2$ plasma.

The stoichiometric ratio of H to N present in the N-containing plasma is from about 0 to 10, and more preferably from about 0.5 to 6.

The N-containing plasma treatment has the effect of etching the F species on the exposed portions 23 of patterned FSG layer 18" within via opening 22, and forming silicon (Si)-rich oxynitride on the surface of the via (oxynitride layer 24).

F-Depleted Layer Formation Proposed Mechanism

Figure 7:
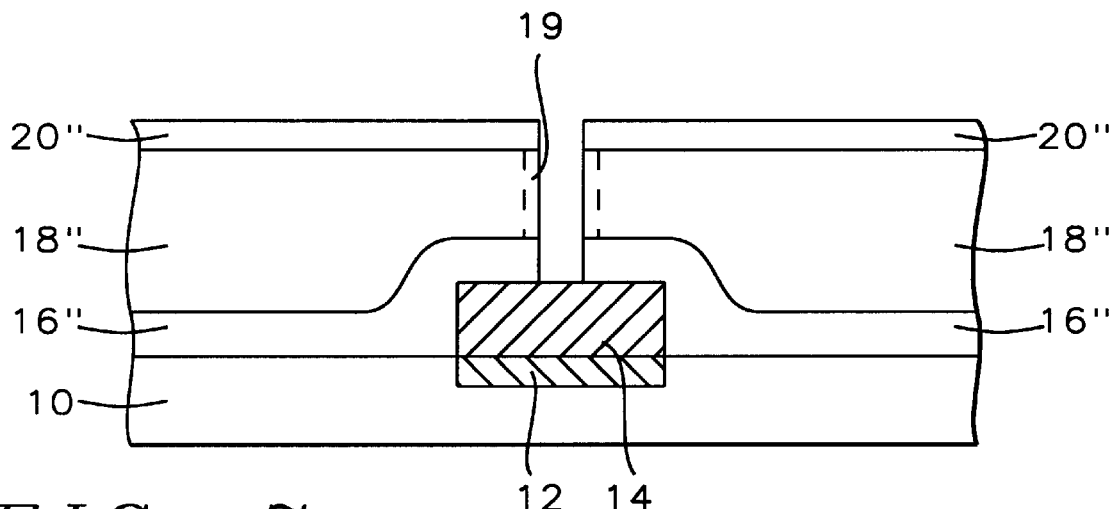

As shown in FIG. 7, in the second proposed mechanism, that may occur when either an N-plasma is used or when an H-plasma is used to treat at least the exposed portions 23 of patterned FSG layer 18", an F-depleted layer 19 may be formed along the exposed FSG layer portions 23. F-depleted layer 19 also effectively serves as a barrier to F-outgassing from FSG layer 18".

The thickness of the F-depleted layer 19 is sufficient to act as a barrier to F outgassing from FSG layer 18".

The conditions for this N-plasma or H-plasma treatment may be similar to those conditions noted above for just the N-plasma treatment. It is not understood why such an N-plasma treatment would form either oxynitride layer 24 or F-depleted layer 19. Regardless of whether oxynitride layer 24 or F-depleted layer 19 is formed, F-outgassing is prevented from FSG layer 18" into metal interconnect 26.

Formation of Metal Interconnect 26

A layer of metal (not shown) is then deposited over SRO layer 20", filling oxynitride layer 24 lined via opening 22 in the event oxynitride (SiON) layer 24 was formed, or within F-depleted layer 19 lined via opening 22 in the event F-depleted layer 19 was formed.

Figure 6:
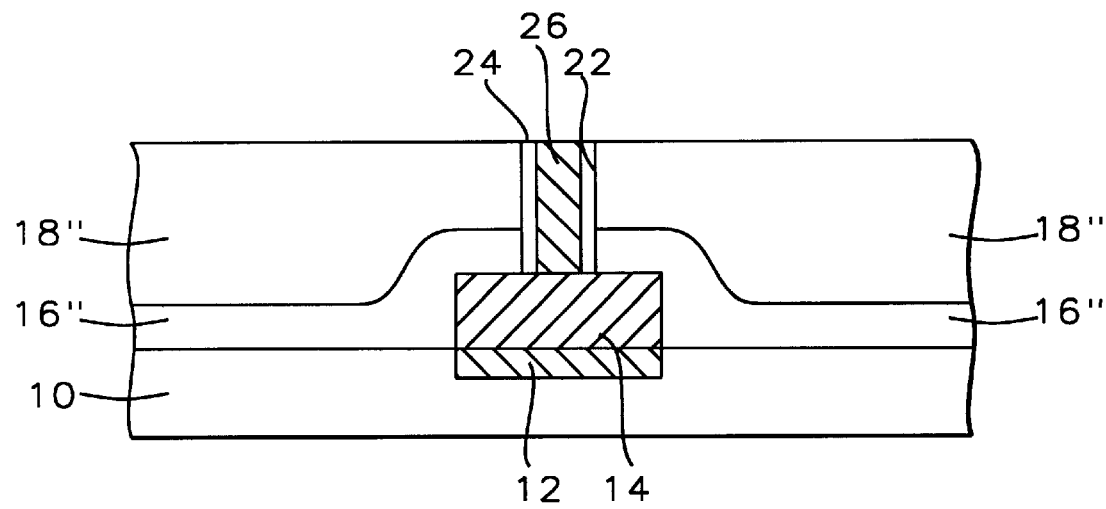
Figure 8:
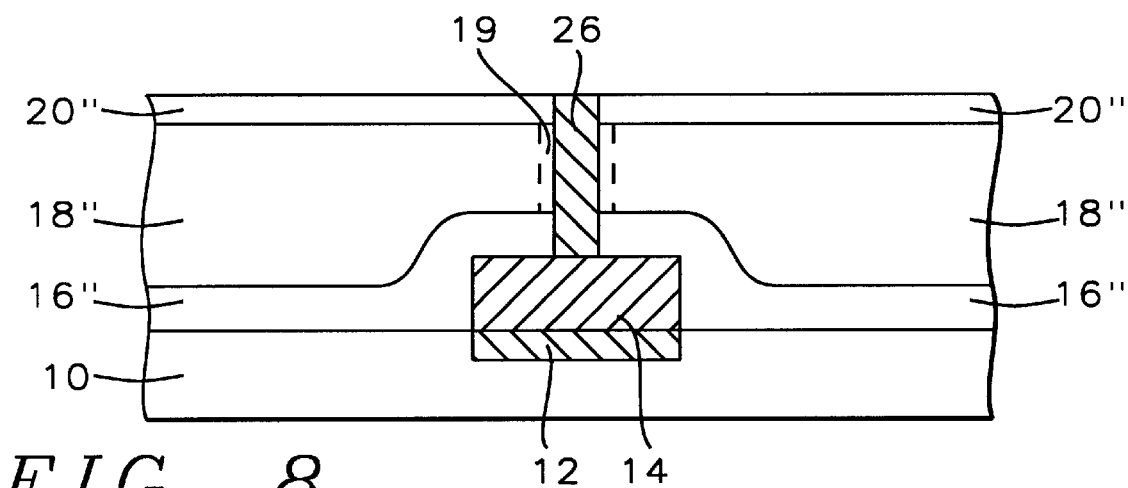

As shown in FIGS. 6 and 8, respectively, the metal layer is planarized to remove the excess of the metal from the upper surface of planarized SRO layer 20", forming planarized metal interconnect 26 within via opening 22.

Metal interconnect 26 may be comprised of aluminum, copper or tungsten and is preferably tungsten.

Without SiON layer 24 as shown in FIG. 6 or F-depleted layer 19 as shown in FIG. 8, the F from FSG layer 18" would react with the copper in interconnect 26 to form $CuF_2$, for example, and cause problems.

Oxynitride layer 24 or F-depleted layer 19 serves as a barrier layer to patterned FSG layer 18" and blocks outgassing or diffusing of F species from patterned FSG layer 18" to metal interconnect 26, thus preventing formation of undesired metal fluorides that affect the electrical resistance and performance of metal interconnect 26.

While particular embodiments of the present invention have been illustrated and described, it is not intended to limit the invention, except as defined by the following claims.

We claim:

1. A method of forming a metal interconnect within a fluorinated silica glass dielectric layer while preventing outgassing from said fluorinated silica glass dielectric layer, comprising the steps of:

providing a semiconductor structure having a semiconductor device structure formed therein;

forming a metal line over said semiconductor structure; said metal line being electrically connected with said semiconductor device structure;

forming an insulating layer over said semiconductor structure, covering said metal line;

forming a fluorinated silica glass dielectric layer over said insulating layer;

planarizing said fluorinated silica glass dielectric layer to form a planarized fluorinated silica glass dielectric layer;

patterning said planarized fluorinated silica glass dielectric layer and said insulating layer to form a via opening to said metal line and exposing portions of said patterned fluorinated silica glass dielectric layer within said via opening;

treating said via opening with a plasma selected from the group consisting of an N-containing plasma, an H-containing plasma, and a combination thereof, wherein said exposed portions of said patterned fluorinated silica glass dielectric layer within said via opening are converted to a barrier layer that prevents said outgassing from said patterned fluorinated silica glass dielectric layer; the plasma treatment being conducted at:

a temperature from about 0 to 520° C.;

a pressure from about 0.001 to 10 Torr;

a power from about 20 to 2000 W; and for from about 3 to 300 seconds; and forming a metal interconnect within said barrier lined via opening.

2. The method of claim 1, further including the step of forming a capping layer over said planarized fluorinated silica glass dielectric layer; wherein said capping layer is also patterned in forming said via opening.

3. The method of claim 1, further including the steps of:

forming a silicon-rich oxide layer over said planarized fluorinated silica glass dielectric layer;

wherein said silicon-rich oxide layer is also patterned in forming said via opening.

4. The method of claim 1, wherein said insulating layer is comprised of a material selected from the group consisting of polymer, silica glass, silicon nitride, silicon oxynitride, and undoped silica glass; and said fluorinated silica glass dielectric layer has a fluorine concentration of from about 0.5 to 8.0 atom %.

5. The method of claim 1, wherein said insulating layer is comprised of undoped silica glass; and said fluorinated silica glass dielectric layer has a fluorine concentration of from about 1.0 to 9.5 atom %.

6. The method of claim 1, wherein said insulating layer has a thickness of from about 500 to 3000 Å, and said planarized fluorinated silica glass dielectric layer 18' has a thickness of from about 4000 to 12,000 Å, and wherein said plasma treatment forms a SiON barrier layer on the exposed sidewalls of said via opening, said SiON barrier layer having a thickness of from about 30 to 1000 Å.

7. The method of claim 1, wherein said insulating layer has a thickness of from about 800 to 2000 Å, and said planarized fluorinated silica glass dielectric layer has a thickness of from about 4500 to 11,500 Å, and wherein said plasma treatment forms a SiON barrier layer on the exposed sidewalls of said via opening, said SiON barrier layer having a thickness of from about 60 to 500 Å.

8. The method of claim 1, wherein said fluorinated silica glass dielectric layer is formed by a method selected from the group consisting of a PECVD method and a HDCVD method.

9. The method of claim 1, wherein said fluorinated silica glass dielectric layer is formed by an HDCVD method.

10. The method of claim 1, wherein said via opening has a height to width ratio of from about 1:1 to 20:1.

11. The method of claim 1, wherein said metal line is comprised of a material selected from the group consisting of aluminum and copper; and said metal interconnect is comprised of a material selected from the group consisting of aluminum, copper and tungsten.

12. The method of claim 1, wherein said N-containing plasma is a plasma selected from the group consisting of an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma.

13. The method of claim 1, wherein said plasma treatment is conducted at a temperature of from about 20 to 450° C., a pressure of from about 0.005 to 5 Torr, and a power of from about 50 to 1000 W for from about 10 to 150 seconds.

14. A method of forming a metal interconnect within a fluorinated silica glass dielectric layer while preventing outgassing from said fluorinated silica glass dielectric layer, comprising the steps of:
   providing a semiconductor structure having a semiconductor device structure formed therein;
   forming a metal line over said semiconductor structure; said metal line being electrically connected with said semiconductor device structure;
   forming an insulating layer over said semiconductor structure, covering said metal line;
   forming a fluorinated silica glass dielectric layer over said insulating layer;
   planarizing said fluorinated silica glass dielectric layer to form a planarized fluorinated silica glass dielectric layer;
   forming a capping layer over said planarized fluorinated silica glass dielectric layer;
   patterning said capping layer, said planarized fluorinated silica glass dielectric layer, and said insulating layer to form a via opening to said metal line and exposing portions of said patterned fluorinated silica glass dielectric layer within said via opening;
   treating said via opening with a plasma; said plasma selected from the group consisting of an N-containing plasma, an H-containing plasma, and a combination thereof, wherein said exposed portions of said patterned fluorinated silica glass dielectric layer are converted to a barrier layer that prevents said outgassing from said patterned fluorinated silica glass dielectric layer; the plasma treatment being conducted at:
      a temperature from about 20 to 450° C.;
      a pressure from about 0.005 to 5 Torr;
      a power from about 50 to 1000 W; and
      for from about 10 to 150 seconds; and
   forming a metal interconnect within said via opening.

15. The method of claim 14, wherein said capping layer is comprised of a material selected from the group consisting of undoped silica glass, phosphorous doped silica glass, boron doped silica glass, boron-phosphorous doped silica glass, silicon nitride, silicon oxynitride, and silicon-rich oxide.

16. The method of claim 14, wherein said insulating layer is comprised of a material selected from the group consisting of polymer, silica glass, silicon nitride, or silicon oxynitride and undoped silica glass; and said fluorinated silica glass dielectric layer has a fluorine concentration of from about 0.5 to 8.0 atom %.

17. The method of claim 14, wherein said insulating layer is comprised of undoped silica glass; and said fluorinated silica glass dielectric layer has a fluorine concentration of from about 1 to 4.5 atom %.

18. The method of claim 14, wherein said insulating layer has a thickness of from about 500 to 3000 Å, and said planarized fluorinated silica glass dielectric layer has a thickness of from about 4000 to 12,000 Å, and said barrier layer is comprised of SiON and has a thickness of from about 30 to 1000 Å.

19. The method of claim 14, wherein said insulating layer has a thickness of from about 800 to 2000 Å, and said planarized fluorinated silica glass dielectric layer has a thickness of from about 4500 to 11,500 Å, and said barrier layer is comprised of SiON and has a thickness of from about 60 to 500 Å.

20. The method of claim 14, wherein said fluorinated silica glass dielectric layer is formed by a method selected from the group consisting of a PECVD method and a HDCVD method.

21. The method of claim 14, wherein said fluorinated silica glass dielectric layer is formed by an HDCVD method.

22. The method of claim 14, wherein said via opening has a height to width ratio of from about 1:1 to 20:1.

23. The method of claim 14, wherein said metal line is comprised of a material selected from the group consisting of aluminum and copper; and said metal interconnect is comprised of a material selected from the group consisting of aluminum, copper and tungsten.

24. The method of claim 14, wherein said N-containing plasma is a plasma selected from the group consisting of an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma.

25. A method of forming a metal interconnect within a fluorinated silica glass dielectric layer while preventing outgassing from said fluorinated silica glass dielectric layer, comprising the steps of:
   providing a semiconductor structure having a semiconductor device structure formed therein;
   forming a metal line over said semiconductor structure; said metal line being electrically connected with said semiconductor device structure;
   forming a undoped silica glass layer over said semiconductor structure, covering said metal line;
   forming a fluorinated silica glass dielectric layer over said undoped silica glass layer; said fluorinated silica glass dielectric layer having a fluorine concentration between about 0.5 and 8.0 atom %;
   planarizing said fluorinated silica glass dielectric layer to form a planarized fluorinated silica glass dielectric layer;
   forming a silicon-rich oxide layer over said planarized fluorinated silica glass dielectric layer;
   patterning said silicon-rich oxide layer, said planarized fluorinated silica glass dielectric layer, and said undoped silica glass layer to form a via opening to said metal line and exposing portions of said patterned fluorinated silica glass dielectric layer within said via opening;
   treating said via opening with a plasma wherein said exposed portions of said patterned fluorinated silica glass dielectric layer are converted to a barrier layer that prevents said outgassing from said patterned fluorinated silica glass dielectric layer; the plasma treatment being conducted at:

a temperature from about 0 to 520° C.;
a pressure from about 0.001 to 10 Torr:
a power from about 20 to 2000 W; and
for from about 3 to 300 seconds; and forming a metal interconnect within said via opening.

26. The method of claim 25, wherein said fluorinated silica glass dielectric layer has a fluorine concentration of from about 1 to 4.5 atom %.

27. The method of claim 25, wherein said undoped silica glass layer has a thickness of from about 500 to 3000 Å, and said planarized fluorinated silica glass dielectric layer has a thickness of from about 4000 to 12,000 Å, and said barrier layer is comprised of SiON and has a thickness of from about 30 to 1000 Å.

28. The method of claim 25, wherein said undoped silica glass layer has a thickness of from about 800 to 2000 Å, and said planarized fluorinated silica glass dielectric layer has a thickness of from about 4500 to 11,500 Å, and said barrier layer is comprised of SiON and has a thickness of from about 60 to 500 Å.

29. The method of claim 25, wherein said fluorinated silica glass dielectric layer is formed by a method selected from the group consisting of PECVD and HDCVD.

30. The method of claim 25, wherein said fluorinated silica glass dielectric layer is formed by a HDCVD method.

31. The method of claim 25, wherein said via opening has a height to width ratio of from about 1:1 to 20:1.

32. The method of claim 25, wherein said metal line is comprised of a material selected from the group consisting of aluminum and copper; and said metal interconnect is comprised of a material selected from the group consisting of aluminum, copper, and tungsten.

33. The method of claim 25, wherein said N-containing plasma is a plasma selected from the group consisting of an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma.

34. The method of claim 25, wherein said N-containing plasma treatment is conducted at a temperature of from about 20 to 450° C., a pressure of from about 0.005 to 5 Torr, and a power of from about 50 to 1000 W for from about 10 to 150 seconds.

* * * * *